United States Patent
Masaki

(10) Patent No.: US 10,018,955 B2
(45) Date of Patent: Jul. 10, 2018

(54) POWER SUPPLY CIRCUIT AND IMAGE FORMING APPARATUS

(71) Applicant: CANON KABUSHIKI KAISHA, Tokyo (JP)

(72) Inventor: Takuya Masaki, Kashiwa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/460,278

(22) Filed: Mar. 16, 2017

(65) Prior Publication Data
US 2017/0277108 A1 Sep. 28, 2017

(30) Foreign Application Priority Data
Mar. 23, 2016 (JP) .................. 2016-059154

(51) Int. Cl.
*H03F 3/217* (2006.01)
*G03G 15/00* (2006.01)

(52) U.S. Cl.
CPC .......... *G03G 15/80* (2013.01); *H03F 3/2173* (2013.01); *H03F 3/217* (2013.01); *H03F 3/2171* (2013.01); *H03F 2200/432* (2013.01); *H03F 2200/51* (2013.01); *H03F 2200/78* (2013.01)

(58) Field of Classification Search
CPC ......... G03G 15/80; H03F 3/2173; H03F 1/04; H03F 1/34; H03F 3/217; H03F 3/2171; H03F 2200/351; H03F 2200/432; H03F 2200/78
USPC .............................................. 330/207 A, 251
See application file for complete search history.

(56) References Cited

U.S. PATENT DOCUMENTS

| | | | | |
|---|---|---|---|---|
| 5,373,435 A | * | 12/1994 | Jayaraman | H02M 7/538 363/17 |
| 5,805,433 A | * | 9/1998 | Wood | H02M 3/1588 363/16 |
| 9,369,045 B2 | * | 6/2016 | Hosokawa | H02M 3/1588 |
| 9,571,038 B1 | * | 2/2017 | van Holland | H03K 17/063 |
| 2003/0206422 A1 | * | 11/2003 | Gucyski | H02M 1/088 363/34 |
| 2017/0063307 A1 | * | 3/2017 | van Holland | H03K 17/063 |

FOREIGN PATENT DOCUMENTS

JP 2014-023272 A 2/2014

* cited by examiner

*Primary Examiner* — Khanh V Nguyen
(74) *Attorney, Agent, or Firm* — Fitzpatrick, Cella, Harper & Scinto

(57) ABSTRACT

A half bridge circuit of a class-D amplifier outputs a voltage in accordance with switching of a first switching element and of a second switching element, to a load. A high side gate drive circuit and a low side gate drive circuit respectively drive the first and second switching elements. A bootstrap capacitor connected between the high side gate drive circuit and an output terminal of the half bridge circuit is charged by a charging current from a second direct-current power supply while the first switching element is off. An inductance component for noise suppression, and a voltage limit element that is connected in parallel with the inductance component and is for limiting a voltage that occurs at the inductance component, are provided on a path in which the charging current flows.

12 Claims, 10 Drawing Sheets

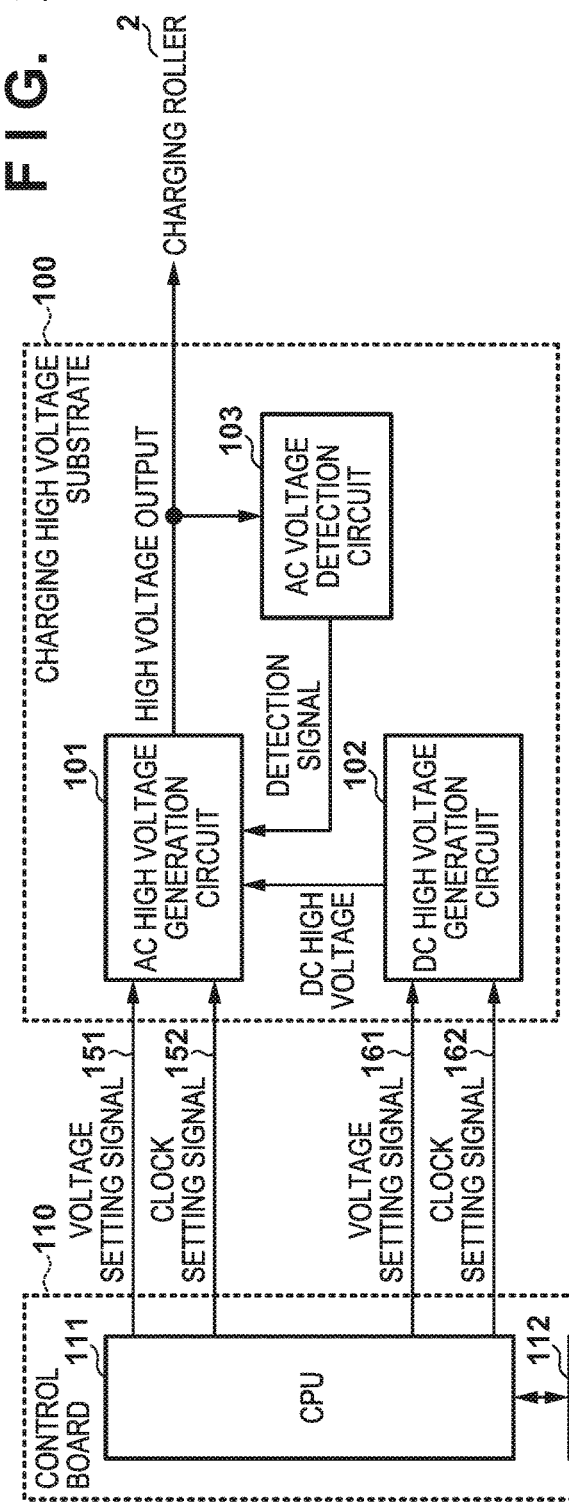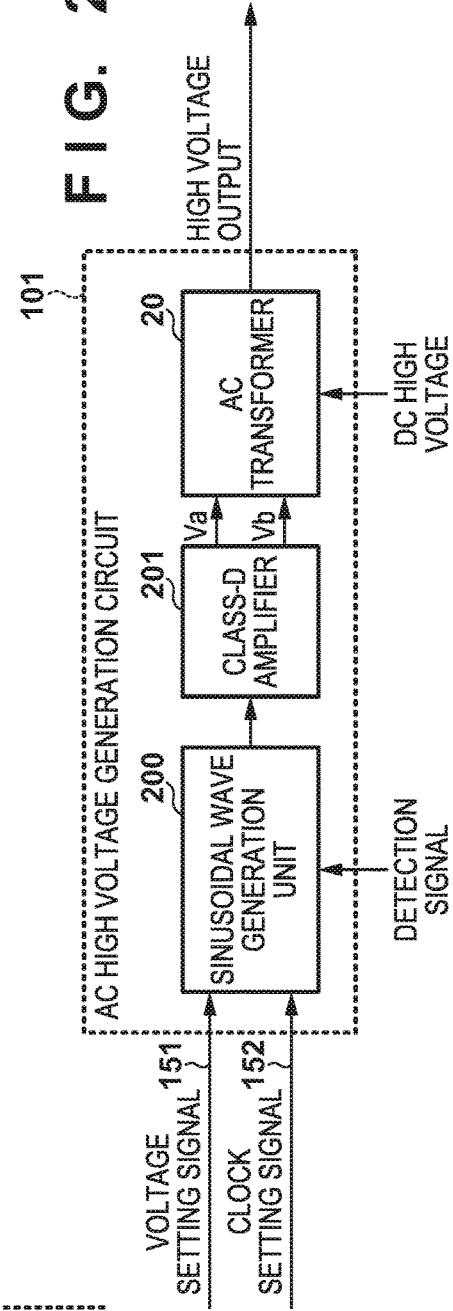

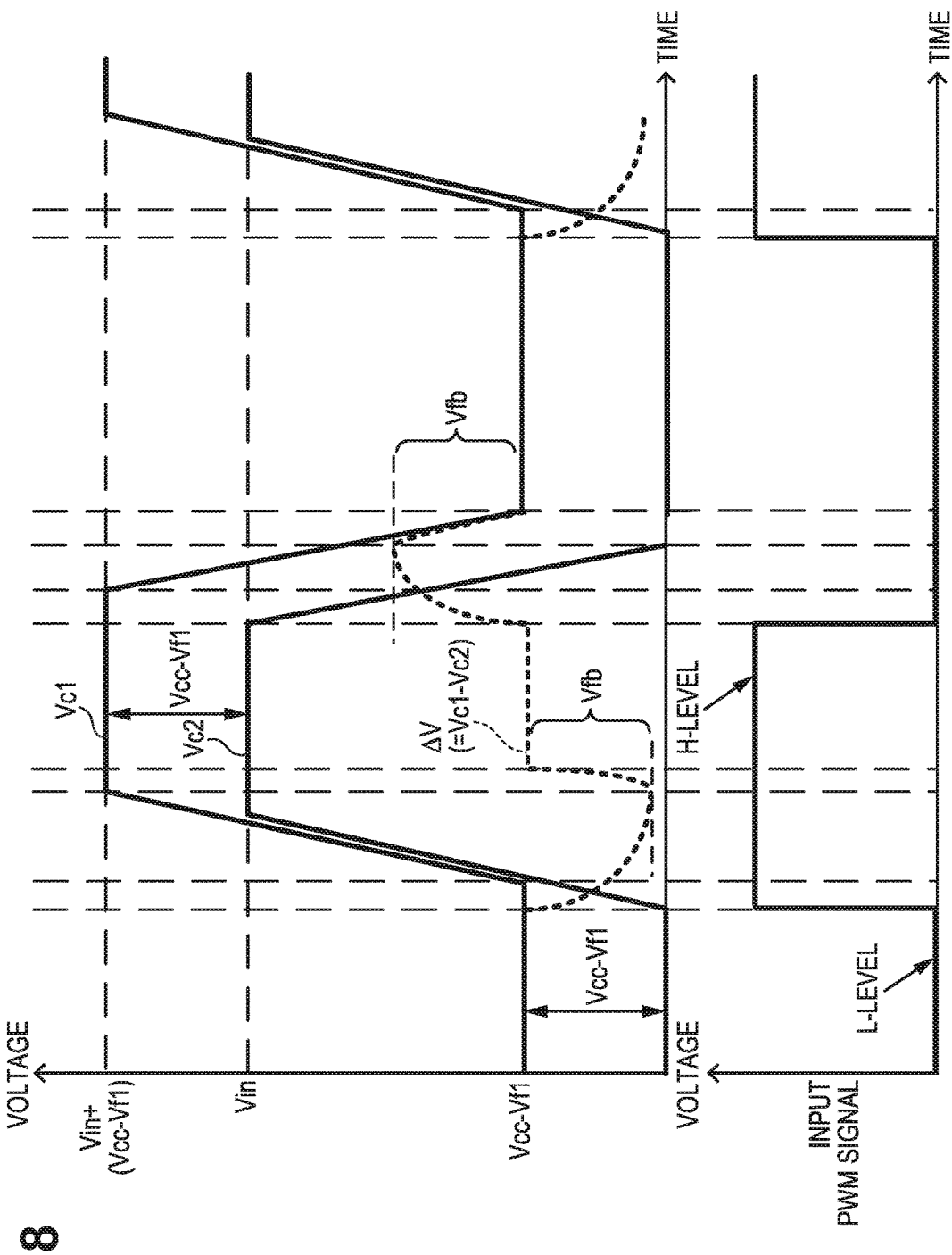

POWER SUPPLY CIRCUIT AND IMAGE FORMING APPARATUS

CLAIM OF PRIORITY

This application claims the benefit of Japanese Patent Application No. 2016-059154, filed Mar. 23, 2016, which is hereby incorporated by reference herein in its entirety.

BACKGROUND OF THE INVENTION

Field of the Invention

The present invention relates to a power supply circuit that includes a drive circuit for driving a switching element of a bridge circuit by using a bootstrap capacitor, and an image forming apparatus provided with the power supply circuit.

Description of the Related Art

In a power supply circuit configured by a class-D amplifier, or the like, a configuration that uses a bootstrap capacitor for driving of a switching element of a high side (power supply side) of a bridge circuit is known. The bootstrap capacitor is connected between an output terminal of the bridge circuit and a drive circuit for driving the switching element of the high side, and is charged by a charging current supplied from the power supply. When driving a high side switching element, the drive circuit uses, as the driving voltage, a voltage obtained by adding the charge voltage of the bootstrap capacitor to the voltage of an output terminal of the bridge circuit. By this, it is possible to stably switch the high side switching element to an on state. Japanese Patent Laid-Open No. 2014-23272 discloses a configuration in which a bootstrap capacitor is used for the generation of an operating voltage necessary for operation of a driving circuit for driving a MOS transistor.

In addition, it is known that, when using such a bootstrap capacitor, a charging current becomes a cause for radiation noise. As a method of suppressing such radiation noise, there is a method of suppressing a high-frequency component of a charging current by providing an inductance component, such as a ferrite bead on a path in which the charging current of the capacitor flows.

However, when the drive circuit switches the switching element between an off state and an on state, a voltage occurs between both ends of the inductance component through which the charging current of the bootstrap capacitor flows (in other words, an electromotive force occurs). As a result, a voltage applied to the drive circuit that uses the charge voltage of the bootstrap capacitor momentarily increases to a high voltage due to the voltage that occurred in the inductance component. Accordingly, a need to use a high-voltage tolerant part that is able to endure such a high voltage for the drive circuit (a high side gate drive circuit) arises, and this leads to an increase in the cost of the part.

SUMMARY OF THE INVENTION

The present invention was conceived in view of the problems described above. The present invention provides a technique for preventing a tolerable voltage required for a high side gate drive circuit from becoming high due to a voltage occurring in an inductance component provided in a path along which a charging current of a bootstrap capacitor flows.

According to one aspect, the present invention provides a power supply circuit comprising a bridge circuit having a first switching element connected to a first direct-current power supply and a second switching element connected in series with the first switching element, and configured to output a voltage, in accordance with switching of the first switching element and of the second switching element, to a load, first and second drive circuits configured to respectively drive the first and second switching elements so that the first and second switching elements alternatingly enter an on state in accordance with an input pulse signal, a capacitor connected between the first drive circuit and an output terminal of the bridge circuit, and configured to generate a charge voltage used for driving of the first switching element by the first drive circuit, in accordance with charging by being supplied with a charging current from a second direct-current power supply while the first switching element is in an off state, an inductance component for noise suppression provided in a path in which the charging current flows, and a voltage limit element connected in parallel with the inductance component, and configured to limit a voltage that occurs at the inductance component.

According to another aspect, the present invention provides an image forming apparatus comprising an image formation unit configured to form an image on a recording material, and a power supply circuit configured to supply a voltage to the image formation unit, wherein the power supply circuit comprises a bridge circuit having a first switching element connected to a first direct-current power supply and a second switching element connected in series with the first switching element, and configured to output a voltage, in accordance with switching of the first switching element and of the second switching element, to a load, first and second drive circuits configured to respectively drive the first and second switching elements so that the first and second switching elements alternatingly enter an on state in accordance with an input pulse signal, a capacitor connected between the first drive circuit and an output terminal of the bridge circuit, and configured to generate a charge voltage used for driving of the first switching element by the first drive circuit in accordance with charging by being supplied with a charging current from a second direct-current power supply while the first switching element is in an off state, an inductance component for noise suppression provided in a path in which the charging current flows, and a voltage limit element connected in parallel with the inductance component, and configured to limit a voltage that occurs at the inductance component.

By virtue of the present invention, it is possible to prevent a tolerable voltage required for a high side gate drive circuit from becoming high due to a voltage occurring at an inductance component provided in a path along which a charging current of a bootstrap capacitor flows.

Further features of the present invention will become apparent from the following description of exemplary embodiments (with reference to the attached drawings).

BRIEF DESCRIPTION OF THE DRAWINGS

FIG. 2A and FIG. 2B are, respectively, a block diagram illustrating a schematic configuration of a control board 110 and a charging high voltage substrate 100, and a block diagram illustrating a schematic configuration of an AC high voltage generation circuit 101.

FIG. 8 illustrates an example of the waveforms of Vc1, Vc2, ΔV, and an input PWM signal that correspond to the configuration of FIG. 6B.

DESCRIPTION OF THE EMBODIMENTS

Hereafter, embodiments of the present invention will be described in detail with reference to the accompanying drawings. It should be noted that the following embodiments are not intended to limit the scope of the appended claims, and that not all of the combinations of features described in the embodiments are necessarily essential to the solving means of the present invention.

<Image Forming Apparatus>

Figure 1:
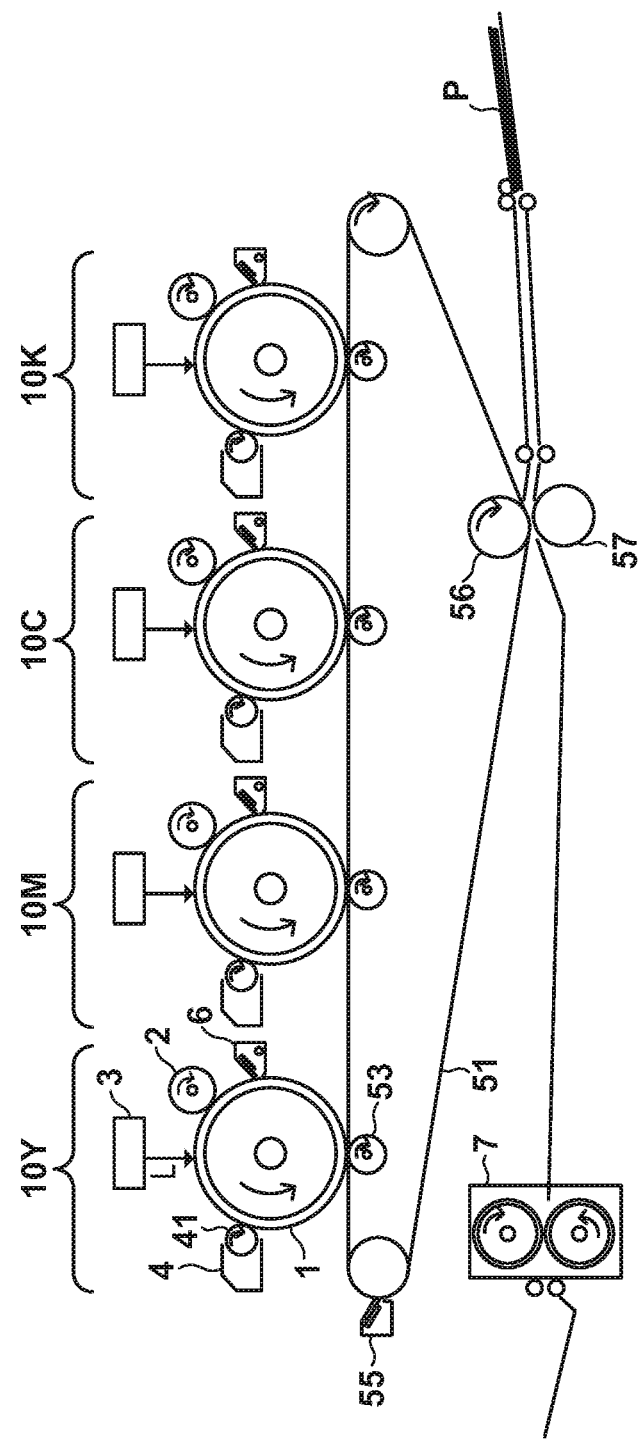
FIG. 1 is a cross-sectional view illustrating a schematic configuration of an image forming apparatus.

FIG. 1 is a cross-sectional view illustrating a schematic configuration of an image forming apparatus provided with a power supply circuit (a high-voltage power supply circuit) according to an embodiment. Although the image forming apparatus may be an image forming apparatus that forms a single-color image, here, an image forming apparatus that forms a multicolor image by using toner (a developing agent) of a plurality of colors is envisioned. The image forming apparatus may be any of a print apparatus, a printer, a copying machine, a multifunction peripheral (an MFP), and a facsimile apparatus, for example.

The image forming apparatus illustrated in FIG. 1 is provided with four image forming stations 10Y, 10M, 10C, and 10K for forming toner images by an electrophotographic method that uses toner of the four colors of yellow (Y), magenta (M), cyan (C), and black (K). In FIG. 1, although reference numerals are only added to configuration parts of the station 10Y that corresponds to yellow, it is possible to employ the same configuration for all of the four stations 10Y, 10M, 10C, and 10K. Each station 10 (10Y, 10M, 10C, and 10K) of the image forming apparatus is provided with a photosensitive drum 1 (a photosensitive member), a charging roller 2, an exposure unit 3, a developer 4, a developing sleeve 41 in the developer, a primary transfer roller 53, and a drum cleaner 6. The image forming apparatus is further provided with an intermediate transfer belt 51, a belt cleaner 55, secondary transfer rollers 56 and 57, and a fixing unit 7. Each station 10 is an example of an image forming unit that forms an image by using toner on an image carrier such as the photosensitive drum 1 or the intermediate transfer belt 51.

Upon receiving an image forming instruction, a CPU 111 (FIG. 2A) of the image forming apparatus causes rotation of the photosensitive drum 1, the charging roller 2, the developing sleeve 41, the intermediate transfer belt 51, the primary transfer roller 53, the secondary transfer roller 57, and fixing rollers in the fixing unit 7, to start. The photosensitive drum 1 and the charging roller 2 are driven by a drum motor (not shown). The charging roller 2 causes the surface of the photosensitive drum 1 to be uniformly charged by being applied thereto a high voltage obtained by superimposing a sinusoidal alternating current (AC) voltage to a direct current (DC) voltage) from a high voltage power supply (the charging high voltage substrate 100 of FIG. 2A). The exposure unit 3 outputs a laser beam (a light beam) L that is modulated based on an image signal, and scans the surface of the photosensitive drum 1 by the laser beam. By this, an electrostatic latent image is formed on the photosensitive drum 1. By a high voltage from a high voltage power supply (not shown) being applied, the developer 4 (the developing sleeve 41) uses toner to develop an electrostatic latent image, and forms a toner image on the photosensitive drum 1. The primary transfer roller 53 transfers the toner image on the photosensitive drum 1 to the intermediate transfer belt 51. Note that a DC high voltage for transfer of the toner image from a high voltage power supply (not shown) is applied to the primary transfer roller 53 and the secondary transfer roller 57.

The toner image on the intermediate transfer belt 51 is conveyed to a secondary transfer unit formed by the intermediate transfer belt 51 and the secondary transfer roller 57. In the meantime, a multi-color toner image is formed on the intermediate transfer belt 51 by toner images of each color formed on the photosensitive drum 1 of each station 10 being combined in order on the intermediate transfer belt 51 and transferred. In the secondary transfer unit, the toner image is transferred to a sheet P that is fed from a feeding unit (a paper feed tray, or the like) and conveyed to a conveyance path. The sheet P may be referred to as a recording sheet, a recording material, a recording medium, printing paper, a transfer material, a transfer sheet, or the like. By heat and pressure being applied by the fixing unit 7, the toner image transferred to the sheet P is fixed to the sheet P. Subsequently, the sheet P is discharged to a discharge unit (a discharge tray, or the like). Note that toner remaining on the photosensitive drum 1 is recovered by the drum cleaner 6. Toner remaining on the intermediate transfer belt 51 is recovered by the belt cleaner 55.

<Control Board and Charging High Voltage Substrate>

FIG. 2A is a block diagram illustrating a schematic configuration of the control board 110 and the charging high voltage substrate 100. The charging high voltage substrate 100 is a substrate on which a power supply circuit for supplying to the charging roller 2 a voltage (a high voltage) for causing the photosensitive drum 1 to be charged is mounted. The control board 110 is provided with the CPU 111 and a memory 112. The charging high voltage substrate 100 is provided with an AC high voltage generation circuit 101, a DC high voltage generation circuit 102, and an AC voltage detection circuit 103.

The CPU 111 in the control board 110 controls the image forming apparatus overall by executing a control program stored in the memory 112. The CPU 111 outputs to the charging high voltage substrate 100 a voltage setting signal 151 and a clock setting signal 152 for controlling the AC high voltage generation circuit 101, and a voltage setting signal 161 and a clock setting signal 162 for controlling the DC high voltage generation circuit 102. The CPU 111 controls operation of the charging high voltage substrate 100 based on these signals. In the charging high voltage substrate 100, the AC high voltage generation circuit 101 and the DC high voltage generation circuit 102 operate based on these signals that are received from the control board 110. The charging high voltage substrate 100 outputs a voltage obtained by superimposing outputs generated by the AC high voltage generation circuit 101 and the DC high voltage generation circuit 102.

The voltage setting signal 151 is a signal for setting a Vpp (a peak-to-peak voltage) of an AC high voltage generated by the AC high voltage generation circuit 101. The clock setting signal 152 is a signal for setting a frequency of the AC high voltage generated by the AC high voltage generation circuit 101. The voltage setting signal 161 is a signal for setting a voltage value of a DC high voltage (a high voltage) generated by the DC high voltage generation circuit 102. The clock setting signal 162 is a signal for setting a frequency of a driving signal for driving a transformer (not shown) in the DC high voltage generation circuit 102.

The AC high voltage generation circuit 101 generates an AC high voltage based on a sinusoidal voltage having the frequency set by the clock setting signal 152 (1.8 kHz in the present embodiment) and having an amplitude set in accordance with the voltage setting signal 151. The DC high voltage generation circuit 102 generates a DC high voltage having a voltage value set by the voltage setting signal 161 by driving a primary side of a transformer (not shown) in accordance with a driving signal of a frequency set in accordance with the clock setting signal 162, and outputs the DC high voltage to the AC high voltage generation circuit 101. The AC high voltage generation circuit 101 outputs to the charging roller 2, which is a load, a voltage obtained by superimposing the generated AC high voltage on the DC high voltage input from the DC high voltage generation circuit 102.

The AC voltage detection circuit 103 detects Vpp of an AC high voltage component in the output voltage of the AC high voltage generation circuit 101, and outputs a detection signal in accordance with the detected Vpp to the AC high voltage generation circuit 101. The AC high voltage generation circuit 101 performs feedback control so that the voltage indicated by the voltage setting signal 151 and the voltage indicated by the detection signal input from the AC voltage detection circuit 103 match. Specifically, if the voltage indicated by the voltage setting signal 151 is greater than the voltage indicated by the detection signal, the AC high voltage generation circuit 101 performs control for making Vpp of the generated AC high voltage greater. In contrast, if the voltage indicated by the voltage setting signal 151 is less than the voltage indicated by the detection signal, the AC high voltage generation circuit 101 performs control for making Vpp of the generated AC high voltage lesser. The voltage (the AC high voltage+the DC high voltage) obtained by superimposing the AC high voltage on the DC high voltage generated in this way is output to the charging roller 2 from the charging high voltage substrate 100.

<AC High Voltage Generation Circuit>

FIG. 2B is a block diagram illustrating a schematic configuration of the AC high voltage generation circuit 101. The AC high voltage generation circuit 101 is provided with a sinusoidal wave generation unit 200, the class-D amplifier 201, and an AC transformer 20. In the AC high voltage generation circuit 101, a sinusoidal wave signal generated by the sinusoidal wave generation unit 200 is input to the class-D amplifier 201 from the sinusoidal wave generation unit 200, and output of the class-D amplifier 201 is converted into a high voltage in the AC transformer 20 and output.

To the sinusoidal wave generation unit 200, the voltage setting signal 151 and the clock setting signal 152 from the CPU 111, as well as the detection signal from the AC voltage detection circuit 103, are input. The sinusoidal wave generation unit 200 generates a sinusoidal wave signal of the frequency indicated by the clock setting signal 152 and outputs the generated signal to the class-D amplifier 201. At that time, the sinusoidal wave generation unit 200 controls the amplitude of the sinusoidal wave signal generated, as described above, so that the voltage indicated by the voltage setting signal 151 and the voltage indicated by the detection signal from the AC voltage detection circuit 103 match.

As explained in detail below, the class-D amplifier 201 converts the sinusoidal wave signal generated by the sinusoidal wave generation unit 200 into a PWM signal of a predetermined frequency (550 kHz in the present embodiment). Furthermore, the class-D amplifier 201 converts the PWM signal into a bridge driving voltage by the gate drive circuit, and drives the full bridge circuit by the bridge driving voltage. The class-D amplifier 201 inputs (applies) the output voltage of the full bridge circuit to a primary side of the AC transformer 20 to thereby output a high voltage from a secondary side of the AC transformer 20.

<Class-D Amplifier>

Figure 3:
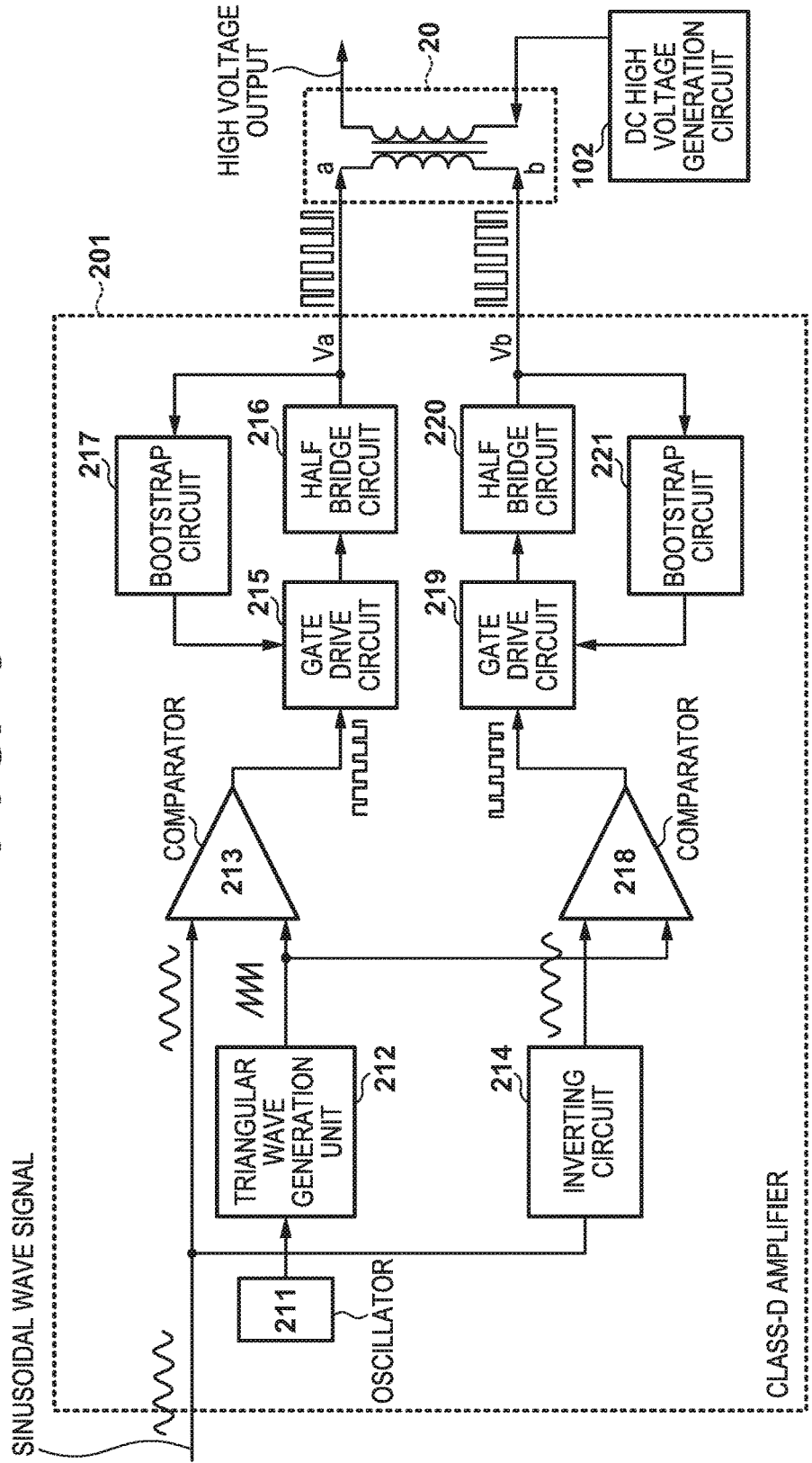
FIG. 3 is a block diagram illustrating a configuration of a class-D amplifier 201.

FIG. 3 is a block diagram illustrating a configuration of the class-D amplifier 201. The class-D amplifier 201 is provided with an oscillator 211, a triangular wave generation unit 212, comparators 213 and 218, an inverting circuit 214, gate drive circuits 215 and 219, half bridge circuits 216 and 220, and bootstrap circuits 217 and 221. In the class-D amplifier 201, the half bridge circuits 216 and 220 constitute the full bridge circuit as described above.

The sinusoidal wave signal generated by the sinusoidal wave generation unit 200 is input to the comparator 213 and the inverting circuit 214. The inverting circuit 214 causes the positive/negative polarity of the input sinusoidal wave signal to invert, and outputs an obtained sinusoidal wave signal. The sinusoidal wave signal output from the inverting circuit 214 is input to the comparator 218. In this way, a sinusoidal wave signal, for which the positive/negative polarity is inverted with respect to the sinusoidal wave signal input to the comparator 213, is input to the comparator 218.

The oscillator 211 generates a clock signal of a predetermined frequency (550 kHz in the present embodiment), and the generated clock signal is output to the triangular wave generation unit 212. The frequency of the clock signal generated by the oscillator 211 is defined in accordance with a time constant of a resistor and a capacitor (not shown) in the oscillator 211. Based on the clock signal input from the oscillator 211, the triangular wave generation unit 212 generates a triangular wave signal of a predetermined frequency that has a predetermined amplitude, and outputs the generated triangular wave signal to the comparators 213 and 218.

The comparators 213 and 218 generate PWM signals by comparing the input triangular wave signal and sinusoidal wave signal. The comparators 213 and 218 output the generated PWM signals to the gate drive circuits 215 and 219, respectively. In the present embodiment, the comparators 213 and 218 output at a high level (an H-level) if the value of the input triangular wave signal is greater than or equal to the value of the input sinusoidal wave signal. In contrast, the comparators 213 and 218 output at a low level (an L-level) if the value of the input triangular wave signal is less than the value of the input sinusoidal wave signal. In this way, a PWM signal that changes between the H-level and the L-level and is for causing switching of respective MOS-FETs (switching elements) Q1 and Q2 in the half bridge circuit 216 is generated by the comparator 213. Similarly, a PWM signal that changes between the H-level and the L-level, and is for causing switching of respective MOS-FETs (switching elements) Q3 and Q4 in the half bridge circuit 220, is generated by the comparator 218.

Figure 4:
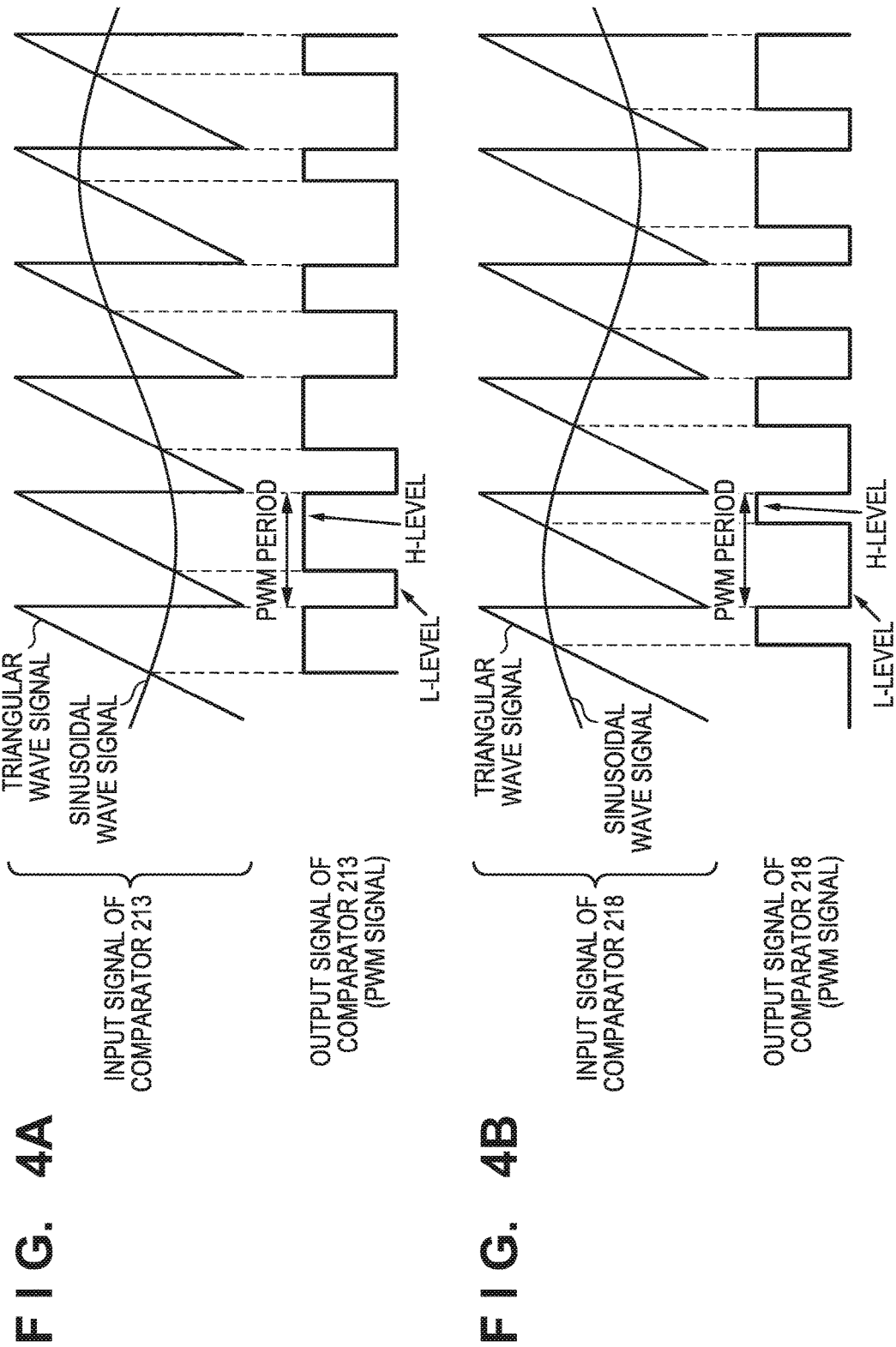
FIG. 4A and FIG. 4B illustrate examples of waveforms of input/output signals of comparators 213 and 218.

Here, FIG. 4A illustrates an example of waveforms of an input signal and an output signal of the comparator 213, and FIG. 4B illustrates an example of waveforms of an input signal and an output signal of the comparator 218. The comparator 213 generates the PWM signal as illustrated in FIG. 4A by comparing the triangular wave signal generated by the triangular wave generation unit 212 and the sinusoidal wave signal generated by the sinusoidal wave generation unit 200. Meanwhile, the comparator 218 generates the PWM signal illustrated in FIG. 4B by comparing the triangular wave signal generated by the triangular wave generation unit 212 and a sinusoidal wave signal for which the polarity is the inverse of that of the sinusoidal wave signal input to the comparator 213. As is understood from FIG. 4A and FIG. 4B, the PWM signal output by the comparator 213 and the PWM signal output by the comparator 218 have the duty ratios, indicating a ratio of a duration of the H-level in one period of the PWM signal (the PWM period), that are different depending on the input sinusoidal wave signal.

The PWM signal output from the comparator 213 and the voltage output from the bootstrap circuit 217 are input to the gate drive circuit 215. In contrast, the PWM signal output from the comparator 218 and the voltage output from the bootstrap circuit 221 are input to the gate drive circuit 219. The bootstrap circuits 217 and 221 are circuits for outputting to the gate drive circuits 215 and 219 a voltage obtained by applying (adding) the charge voltage of the bootstrap capacitors C1 and C2 to voltages Va and Vb output from the half bridge circuits 216 and 220, respectively.

The gate drive circuits 215 and 219 generate and output bridge driving voltages based on the PWM signals output from the comparators 213 and 218, and the voltages output from the bootstrap circuits 217 and 221. The bridge driving voltages output from the gate drive circuits 215 and 219 are input to the half bridge circuit 216 and the half bridge circuit 220, respectively. In other words, the bridge driving voltages are input to a full bridge circuit configured by the half bridge circuit 216 and the half bridge circuit 220.

The voltage Va output from the half bridge circuit 216 is supplied (applied) to the bootstrap circuit 217 and a point "a" of a primary side of the AC transformer 20. The voltage Vb output from the half bridge circuit 220 is supplied (applied) to the bootstrap circuit 221 and a point "b" of the primary side of the AC transformer 20. In accordance with an electrical potential difference between the voltage Va and the voltage Vb that are applied to the primary side of the AC transformer 20, a current flows on the primary side of the AC transformer 20 (in other words, between point "a" and point "b"). As a result, an AC high voltage occurs on a secondary side of the AC transformer 20. The AC high voltage output from the secondary side of the AC transformer 20 is superimposed on the DC high voltage output from the DC high voltage generation circuit 102, and is output to the charging roller 2, which is the load.

<Driving Circuit for Bridge Circuit>

Figure 5:
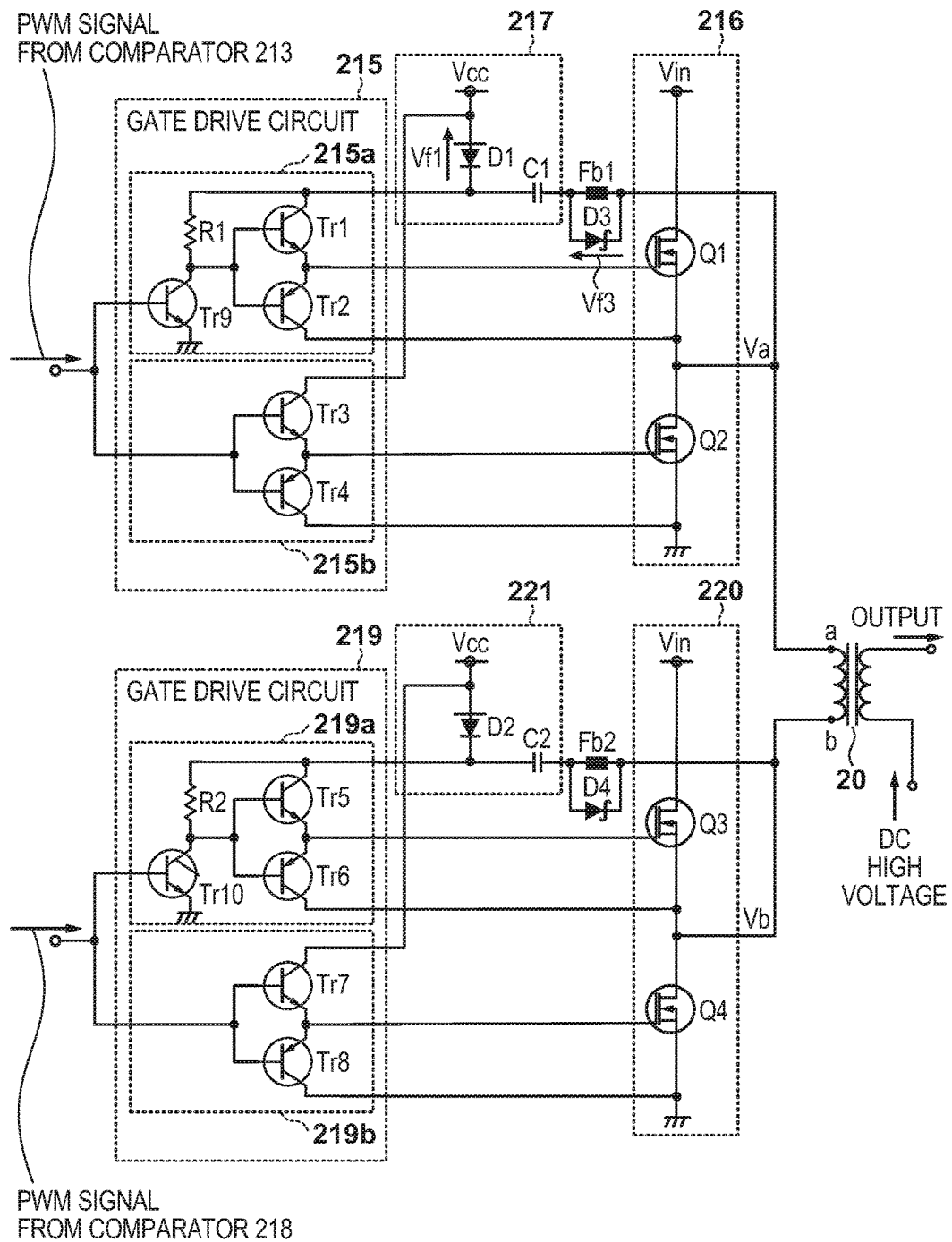
FIG. 5 is a circuit diagram illustrating a configuration of a driving circuit for a full bridge circuit in the class-D amplifier 201.

FIG. 5 is a circuit diagram illustrating a configuration of the full bridge circuit (the half bridge circuits 216 and 220) and a driving circuit for the full bridge circuit, that are included in the class-D amplifier 201. Typically, a bridge circuit applied to a class-D amplifier, or the like, uses a bootstrap capacitor for driving of a switching element on a high side (a power supply side). The class-D amplifier 201 of the present embodiment, as explained below, uses bootstrap capacitors C1 and C2 for driving of the half bridge circuits 216 and 220. In the class-D amplifier 201, the gate drive circuit 219, the half bridge circuit 220, and the bootstrap circuit 221 have similar configurations to those of the gate drive circuit 215, the half bridge circuit 216, and the bootstrap circuit 217, respectively. Accordingly, an explanation is given below primarily regarding the gate drive circuit 215, the half bridge circuit 216, and the bootstrap circuit 217.

(Half Bridge Circuit 216)

As illustrated in FIG. 5, the half bridge circuit 216 is provided with Q1, which is a high side switching element connected to a first direct-current power supply (a power supply voltage Vin, 24V in the present embodiment), and Q2, which is a low side (ground side) switching element connected in series to Q1. Q1 and Q2 are both configured by n-type MOS-FETs. In the present embodiment, the half bridge circuit 216 is an example of a bridge circuit that outputs to the load a voltage in accordance with switching of Q1 (a first switching element) and of Q2 (a second switching element).

Q1 and Q2 of the half bridge circuit 216 are respectively driven by a gate drive circuit 215a and a gate drive circuit 215b that constitute the gate drive circuit 215. A bridge driving voltage output from the gate drive circuit 215a is input to a gate terminal of Q1. In contrast, a bridge driving voltage output from the gate drive circuit 215b is input to a gate terminal of Q2. The drain terminal of Q1 is connected to the first direct-current power supply (Vin), and the source terminal of Q1 is connected to the drain terminal of Q2. The source terminal of Q2 is connected to ground. In this way, Q1 and Q2 are connected in series between the first direct-current power supply (Vin) and ground. The voltage Va, that is supplied from the half bridge circuit 216 via the AC transformer 20 to the load, is output from an output terminal provided at a connection point between Q1 and Q2.

(Gate Drive Circuit 215)

The gate drive circuit 215 is configured by the gate drive circuit 215a for driving Q1, and the gate drive circuit 215b for driving Q2. The gate drive circuit 215a is provided with an n-type transistor Tr1, a p-type transistor Tr2, and an n-type transistor Tr9. The gate drive circuit 215b is provided with an n-type transistor Tr3, and a p-type transistor Tr4.

The PWM signal output from the comparator 213 is input to the base terminal of each of Tr9, Tr3, and Tr4. The collector terminal of Tr9 is connected to one end of a resistor R1, the base terminal of Tr1 and the base terminal of Tr2, and the emitter terminal of Tr9 is connected to ground. The other end of the resistor R1 is connected to a cathode terminal of a bootstrap diode D1 in the bootstrap circuit 217, and is connected to a second direct-current power supply (a power supply voltage Vcc, 5V in the present embodiment) via D1.

The collector terminal of Tr1 is connected to the cathode terminal of D1 in the bootstrap circuit 217, and is connected to the second direct-current power supply (Vcc) via D1. Note that the bootstrap capacitor C1 is connected to the collector terminal of Tr1 in parallel with D1. The collector terminal of Tr2 is connected to the connection point between Q1 and Q2 in the half bridge circuit 216. The collector terminal of Tr3 is connected to the second direct-current power supply (Vcc). The collector terminal of Tr4 is connected to ground. For Tr1 and Tr2, the emitter terminals are mutually connected to each other. For Tr3 and Tr4, the emitter terminals are mutually connected to each other.

The gate drive circuit 215a outputs, from a connection point between the emitter terminals of Tr1 and Tr2, the bridge driving voltage for Q1 that is converted from the input PWM signal (input pulse signal). In addition, the gate drive circuit 215b outputs the bridge driving voltage for Q2 that is converted from the input PWM signal from a connection point between the emitter terminals of Tr3 and Tr4. In accordance with the input PWM signal, the gate drive circuit 215a and the gate drive circuit 215b respectively drive Q1 and Q2 so that Q1 and Q2 alternatingly enter an on state.

(Bootstrap Circuit 217)

The bootstrap circuit 217 provided between the output terminal of the half bridge circuit 216 (connection point between Q1 and Q2) and the gate drive circuit 215a is configured by the bootstrap diode D1 and the bootstrap capacitor C1. The anode terminal of D1 is connected to the second direct-current power supply (Vcc), and the cathode terminal of D1 is connected to the gate drive circuit 215a. C1 is connected between the gate drive circuit 215a and the output terminal of the half bridge circuit 216. Note that C1 and the cathode terminal of D1 are connected to the resistor R1 and the collector terminal of Tr1 in the gate drive circuit 215a. As explained below, by a charging current being supplied from the second direct-current power supply (Vcc) while Q1 is in the off state to charge C1, a charge voltage used for the driving of Q1 in accordance with the gate drive circuit 215a occurs at C1.

In the present embodiment, as explained below, on the path in which the charging current of C1 flows, a ferrite bead Fb1 (an inductance component for noise suppression) for suppressing radiation noise caused by the charging current is provided. Specifically, Fb1 is inserted between C1 and the output terminal of the half bridge circuit 216. In the present embodiment, a Schottky barrier diode D3 (a voltage limit element) for limiting the voltage generated at Fb1 is further connected in parallel with Fb1. Diode D3 is arranged in a direction so that a current from the second direct-current power supply (Vcc) is caused to pass through, by an anode terminal being connected to C1 and a cathode terminal being connected to the output terminal of the half bridge circuit 216. As explained below, by connecting D3 in parallel with Fb1, a voltage that occurs at Fb1 is limited to a voltage that does not exceed a threshold voltage which is a voltage for D3 to enter an on state (a conductive state).

<Role of Bootstrap Circuit>

Figure 6A:
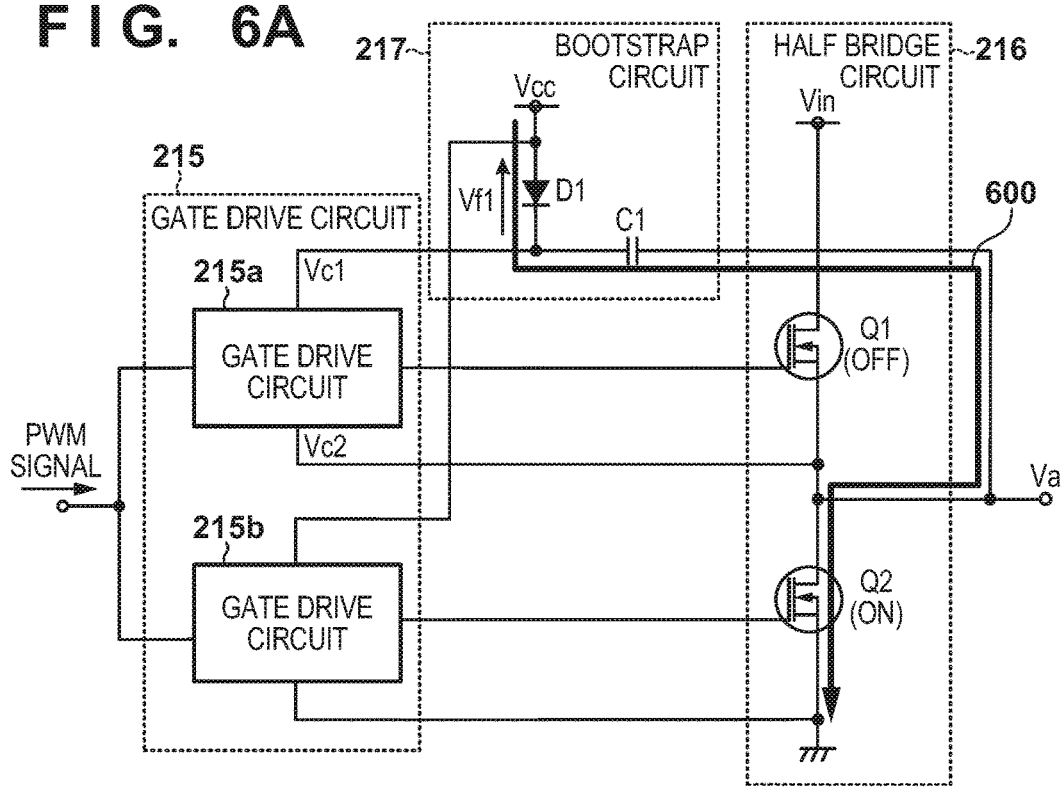
FIG. 6A and FIG. 6B are circuit diagrams illustrating comparative examples for the driving circuit of FIG. 5.

Next, with reference to FIG. 6A through FIG. 8, an explanation is given regarding roles of the bootstrap circuit 217, Fb1, and D3 (the bootstrap circuit 221, Fb2, and D4) in the class-D amplifier 201 of the present embodiment. FIG. 6A illustrates something that excludes Fb1 and D3 from the circuit arrangement that includes the gate drive circuit 215, the half bridge circuit 216, and, the bootstrap circuit 217 illustrated in FIG. 5.

In the class-D amplifier 201, the PWM signal input to the gate drive circuit 215 is converted into driving voltages for driving Q1 and Q2 by the gate drive circuit 215a and the gate drive circuit 215b, respectively. The driving voltages resulting from the conversion of the PWM signal are respectively applied to the gate terminals of Q1 and Q2 from the gate drive circuit 215a and the gate drive circuit 215b. By this, Q1 and Q2 are switched so as to alternatingly enter the on state in accordance with the PWM signal input to the gate drive circuit 215. For example, if the input PWM signal is the H-level, Q1 enters the off state and Q2 enters the on state. If the input PWM signal is the L-level, Q1 enters the on state and Q2 enters the off state. As the result of such switching of Q1 and of Q2, the input PWM signal is amplified in accordance with the voltage Vin of the first direct-current power supply connected to Q1 and Q2, is output as the voltage Va from the connection point (output terminal) between Q1 and Q2, and is supplied to the load.

Here, voltages Vc1 and Vc2 illustrated in FIG. 6A correspond to high side and low side input terminal voltages of the gate drive circuit 215a. The voltage Vc2 is equivalent to the source terminal voltage of Q1, and the voltage Vc1 is equivalent to a voltage obtained by adding the voltage of C1 to the source terminal voltage of Q1 (the drain terminal voltage of Q2=Vc2). When causing Q1 to enter the on state in accordance with the PWM signal, the gate drive circuit 215a applies the voltage Vc1 as the driving voltage to the gate terminal of Q1. When causing Q1 to enter the off state in accordance with the PWM signal, the gate drive circuit 215a applies the voltage Vc2 as the driving voltage to the gate terminal of Q1.

Note that, when causing Q2 to enter the on state in accordance with the PWM signal, the gate drive circuit 215b applies the voltage input from the second direct-current power supply (Vcc) as the driving voltage to the gate terminal of Q2. When causing Q2 to enter the off state in accordance with the PWM signal, the gate drive circuit 215b applies the source terminal voltage of Q2 as the driving voltage to the gate terminal of Q2.

When Q1 enters the off state and Q2 enters the on state, the potential of the output terminal of the half bridge circuit 216 becomes equal to ground, thereby D1 entering the on state. By this, as illustrated in FIG. 6A, a current (a charging current) is supplied from the second direct-current power supply (Vcc) to C1 via D1, and C1 is charged. While Q1 is off, the charging current flows along a path 600 from the second direct-current power supply (Vcc) to reach ground via D1, C1, the output terminal of the half bridge circuit 216, and Q2, which is in the on state. When charging is complete, the voltage of C1 (the charge voltage) is equivalent to a voltage (=Vcc−Vf1) obtained by subtracting a threshold voltage Vf1 of D1 from Vcc. While Q1 is in the off state and Q2 is in the on state, the charge voltage of C1 is input to the gate drive circuit 215a as the voltage Vc1.

Subsequently, when switching Q1 to the on state (and Q2 to the off state), the gate drive circuit 215a applies the voltage Vc1, obtained by adding the charge voltage of C1 to the voltage Vc2 that has the same potential as the source terminal voltage of Q1, to the gate terminal of Q1 as the driving voltage. Specifically, when Q1 enters the on state and Q2 enters the off state, the potential of the output terminal of the half bridge circuit 216 (the source terminal of Q1) becomes equal to that of the first direct-current power supply (Vin), thereby D1 entering the off state. Accordingly, the voltage Vc1 is a voltage obtained by boosting the voltage Vin of the first direct-current power supply in accordance with the charge voltage of C1. In this way, when Q1 is caused to enter the on state, the driving voltage applied to the gate terminal of Q1 becomes a voltage obtained by boosting the voltage Vin of the first direct-current power supply in accordance with the charge voltage of C1. Accordingly, it becomes possible to stably switch Q1 from the off state to the on state.

Figure 7:
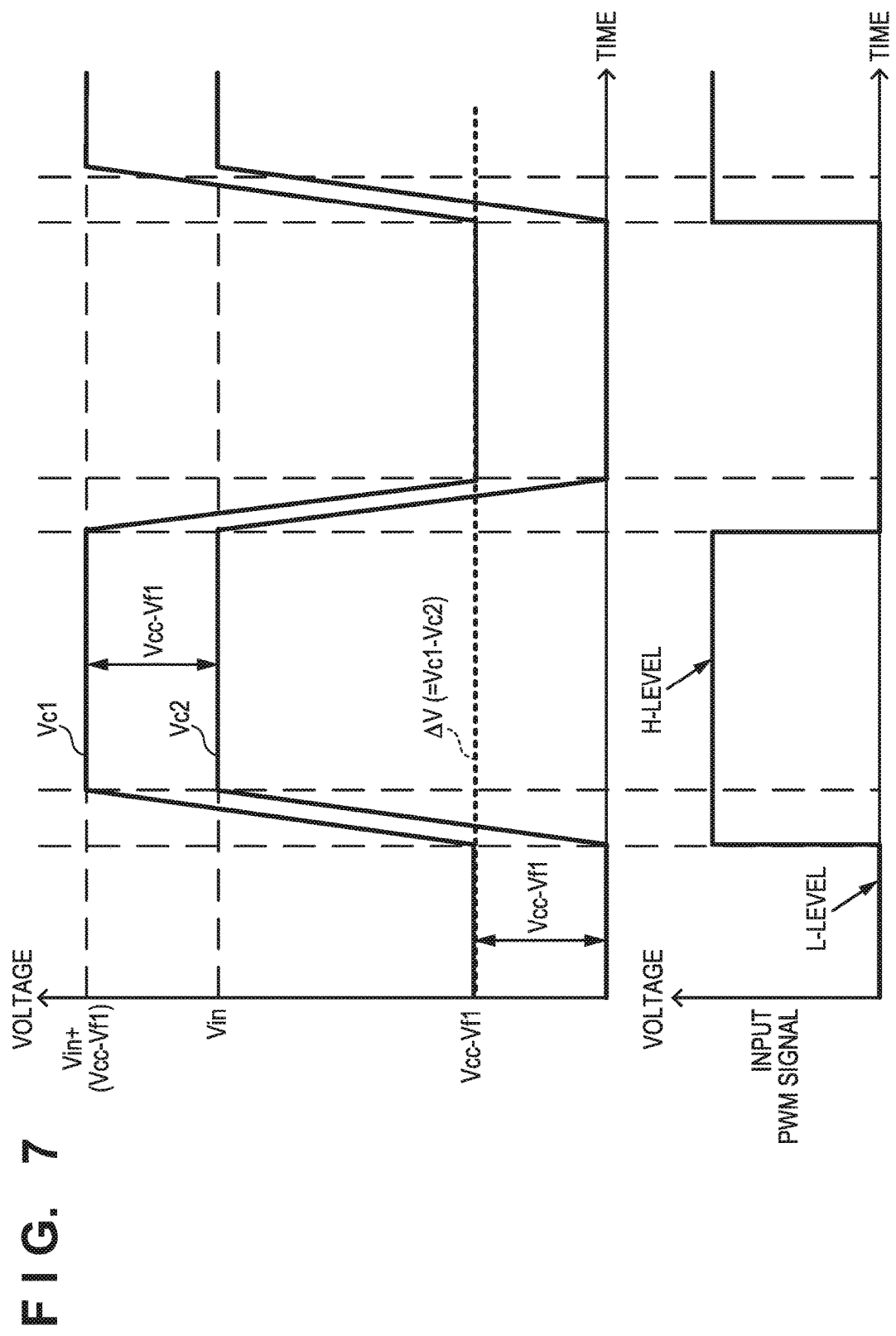
FIG. 7 illustrates an example of the waveforms of Vc1, Vc2, ΔV, and an input PWM signal that correspond to the configuration of FIG. 6A.

FIG. 7 illustrates an example of each waveform of the voltages Vc1 and Vc2, the electrical potential difference ΔV between Vc1 and Vc2 (=Vc1−Vc2), and the PWM signal input to the gate drive circuit 215, when C1 is sufficiently charged, and corresponds to FIG. 6A. As described above, if the input PWM signal is the L-level, Q1 enters the off state and Q2 enters the on state. In this case, the voltage Vc2 becomes 0V, which is equivalent to ground, and the voltage Vc1 becomes the charge voltage of C1 (Vcc−Vf1). In contrast, if the input PWM signal is the H-level, Q1 enters the on state and Q2 enters the off state. In this case, the voltage Vc2 becomes Vin which has the same potential as the first direct-current power supply, and the voltage Vc1 becomes a voltage obtained by adding the charge voltage of C1 to Vin (Vin+Vcc−Vf1). As illustrated in FIG. 7, it is understood that a maximum value of the voltage Vc1 that is applied to the gate drive circuit 215a is the voltage while the PWM signal is the H-level (Vin+Vcc−Vf1). In addition, it is understood that the electrical potential difference ΔV between Vc1 and Vc2 (=Vc1−Vc2) is independent of the level of the input PWM signal, and is always equivalent to the charge voltage of C1 (Vcc−Vf1).

<Roles of Fb1 and D1>

Figure 6B:
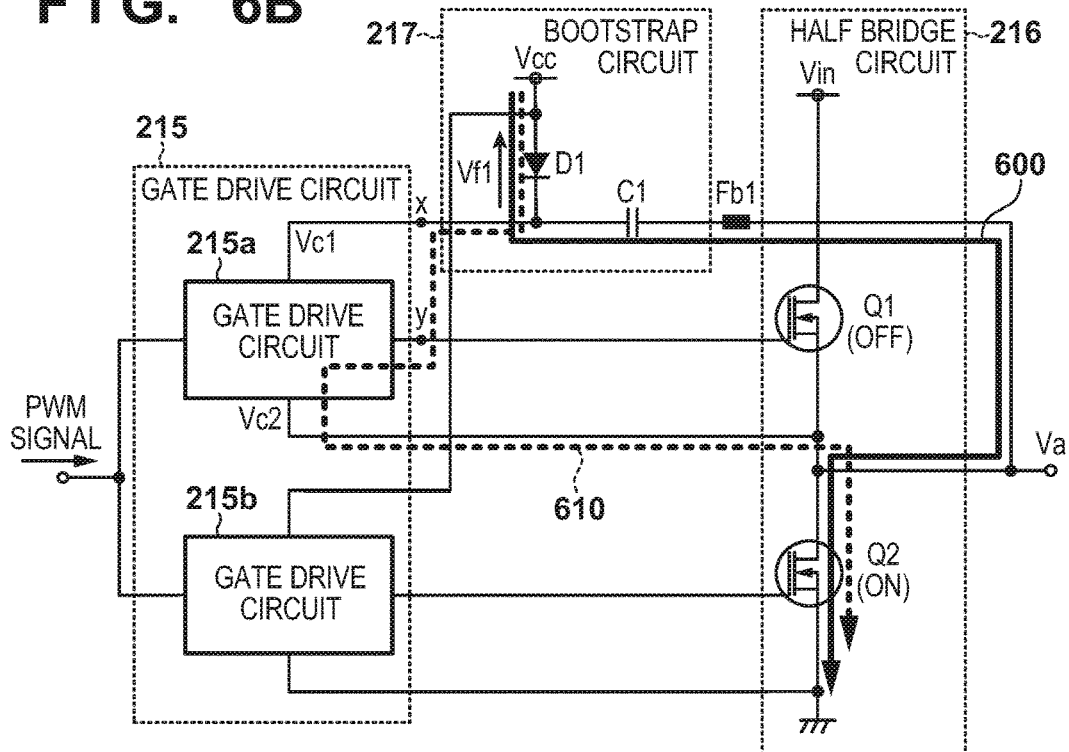

As described above, in the class-D amplifier 201, by the action of the bootstrap capacitor C1 (the bootstrap circuit 217), it becomes possible to stably switch Q1 from the off state to the on state. However, if the bootstrap capacitor C1 is used in the driving of the high side switching element (Q1), it is known that, while stable switching of Q1 becomes possible, a charging current for charging C1 becomes a cause for radiation noise. Such radiation noise can be suppressed by inserting an inductance component, such as the ferrite bead Fb1, in the path 600 along which the charging current of C1 flows, as illustrated in FIG. 6B. In other words, by the insertion of the inductance component, it becomes possible to suppress a high-frequency component of the charging current, which is a cause of the radiation noise.

Meanwhile, as illustrated in FIG. 6B, if ferrite bead Fb1 is inserted into the path 600, a voltage occurs between both ends of Fb1 that is connected in series with C1, in accordance with a change of the charging (discharge) current of C1 when the level of the PWM signal switches. In other words, an electromotive force that impairs the flow of the charging (discharge) current occurs at Fb1. In the configuration illustrated in FIG. 6B, the electrical potential difference ΔV (=Vc1−Vc2) between Vc1 and Vc2 is equivalent to a voltage obtained by adding the voltage that occurs at Fb1 to the charge voltage (Vcc−Vf1) of C1. Accordingly, the voltage that occurs at Fb1 causes the electrical potential difference ΔV to change, and because of this, the voltage Vc1 that is applied to the gate drive circuit 215a changes.

Here, FIG. 8 illustrates an example of each waveform of the voltages Vc1 and Vc2, the electrical potential difference ΔV (=Vc1−Vc2), and the PWM signal input to the gate drive circuit 215, with the configuration illustrated in FIG. 6B. Note that, for the voltage Vc1 of FIG. 8, consideration is not given to the voltage that occurs at Fb1, and accordingly, the waveform of Vc1 is similar to that of FIG. 7. As illustrated in FIG. 8, immediately after the input PWM signal switches from the L-level to the H-level, the electrical potential difference ΔV temporarily decreases from a value equivalent to the charge voltage (Vcc−Vf1), due to a voltage Vfb that occurs at Fb1. Conversely, immediately after the input PWM signal switches from the H-level to the L-level, the electrical potential difference ΔV temporarily increases from a value equivalent to the charge voltage (Vcc−Vf1), due to a voltage Vfb that occurs at Fb1. The voltage Vc1 applied to the gate drive circuit 215a changes in accordance with this electrical potential difference ΔV.

In this way, a maximum value of the voltage Vc1 that is applied to the gate drive circuit 215a immediately after the input PWM signal switches from the H-level to the L-level becomes comparatively high compared to a case in which Fb1 is not inserted into the path 600. Accordingly, there is a need to increase the tolerable voltage of parts in the gate drive circuit 215a for the case in which Fb1 is inserted into the path 600 in comparison to the case in which it is not inserted. However, usage of high-voltage tolerant parts leads to an increase in cost. To avoid usage of high-voltage tolerant parts, there is a need to use a protection circuit for preventing a voltage applied to the gate drive circuit 215a from exceeding the tolerable voltage of parts.

In a case of using such a protection circuit, it is typical to make it so that a certain voltage or more does not act on a protection target part, by connecting a diode in parallel to the protection target part. For example, in the example illustrated in FIG. 6B, a case in which the gate drive circuit 215a is configured by a push-pull circuit based on a high side n-type transistor Tr1 and a low side p-type transistor Tr2 is envisioned. In such a case, when the PWM signal switches from the H-level to the L-level, the electrical potential difference ΔV becomes large, Tr1 enters the on state, and Tr2 enters the off state. As a result, a large voltage is applied across the emitter and the collector of Tr1. Accordingly, by connecting a diode (for example, a Zener diode) in parallel with Tr1 (in other words between a point "x" and a point "y" in FIG. 6B), it is possible to configure a protection circuit of the gate drive circuit 215a. By this, it is possible to prevent the voltage applied across the emitter and the collector of Tr1 from exceeding the tolerable voltage of Tr1.

However, if a certain voltage or more is applied to the diode connected between the point "x" and the point "y", the diode switches from an off state (a non-conductive state) to an on state (a conductive state). By this, as illustrated in FIG. 6B, the current that should flow along the path 600 via C1 may flow along a path 610 via the diode connected between the point "x" and the point "y". As a result, there is the possibility that C1 cannot be sufficiently charged, and stable switching of Q1 cannot be performed.

Accordingly, in the present embodiment, instead of a protection circuit as described above, D3 is connected in parallel with Fb1 as a voltage limit element for limiting the voltage that occurs at Fb1 (an inductance component) provided on the path 600, as illustrated in FIG. 5. This aims to prevent a tolerable voltage required for the gate drive circuit 215a from becoming high due to the voltage that occurs at Fb1.

<Operation of Class-D Amplifier>

Figure 9A:
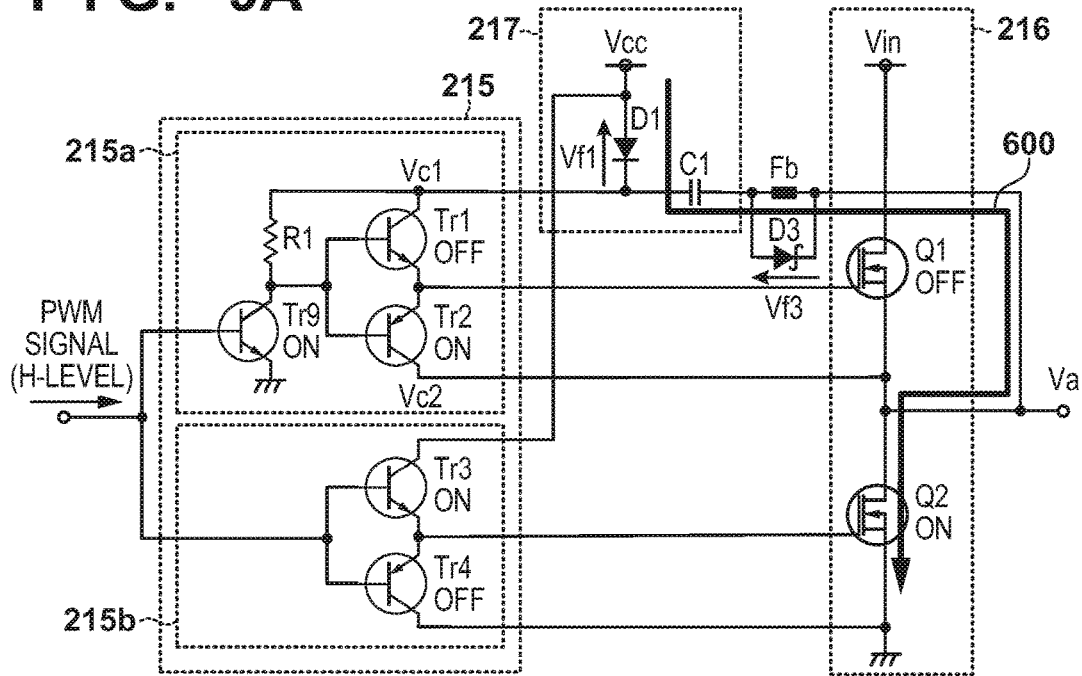
FIG. 9A and FIG. 9B illustrate operations of driving circuits for a full bridge circuit in the class-D amplifier 201.
Figure 9B:
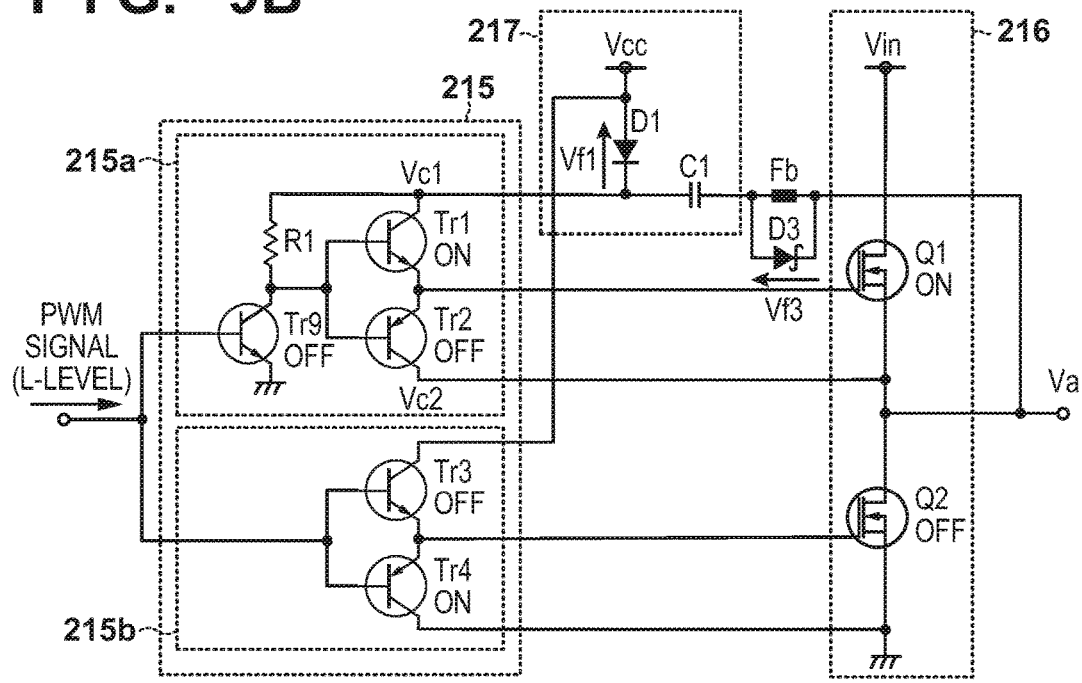
Figure 10:
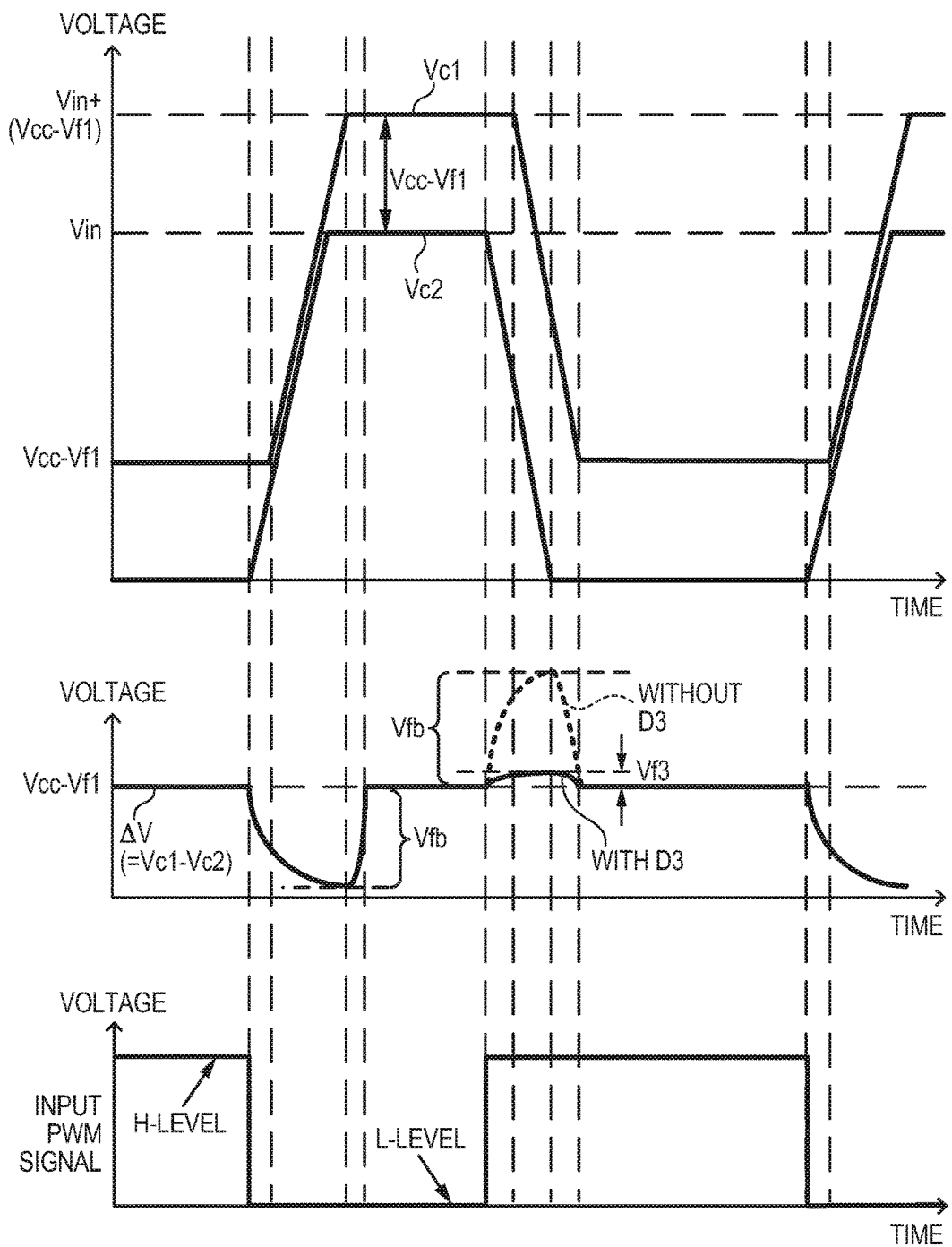
FIG. 10 illustrates an example of waveforms of Vc1, Vc2, ΔV and the input PWM signal.

Next, with reference to FIG. 9A, FIG. 9B and FIG. 10, an explanation is given regarding operation of the gate drive circuit 215, the bootstrap circuit 217, and the half bridge circuit 216 in the class-D amplifier 201. FIG. 9A illustrates operation of the gate drive circuit 215, the bootstrap circuit 217, and the half bridge circuit 216 when the PWM signal output from the comparator 213 is the H-level, and FIG. 9B illustrates their operation when the PWM signal is the L-level.

When the PWM signal output from the comparator 213 is the H-level, in the gate drive circuit 215a, Tr9 enters the on state, Tr1 enters the off state, and Tr2 enters the on state, as illustrated in FIG. 9A. As a result, an L-level driving voltage (a voltage between the gate and the source that is less than the threshold voltage) is applied to the gate terminal of Q1, and Q1 enters the off state. Meanwhile, in the gate drive circuit 215b, Tr3 enters the on state and Tr4 enters the off state. As a result, an H-level driving voltage (a voltage between the gate and the source that is greater than or equal to the threshold voltage) is applied to the gate terminal of Q2, and Q2 enters the on state. Upon Q1 entering the off state and Q2 entering the on state in this way, a current flows from the second direct-current power supply (Vcc) to C1 through D1, and C1 is thus charged. Ultimately, the charge voltage of C1 becomes the voltage (=Vcc−Vf1) obtained by subtracting the threshold voltage Vf1 of D1 (0.4 V in the present embodiment) from Vcc.

When the PWM signal output from the comparator 213 is the L-level, in the gate drive circuit 215a, Tr9 enters the off state, Tr1 enters the on state, and Tr2 enters the off state, as illustrated in FIG. 9B. As a result, an H-level voltage is applied to the gate terminal of Q1, and Q1 enters the on state. Meanwhile, in the gate drive circuit 215b Tr3 enters the off state and Tr4 enters the on state. As a result, an L-level voltage is applied to the gate terminal of Q2, and Q2 enters the off state.

In this way, by Q1 and Q2 being switched in accordance with changes of the level of the PWM signal input to the gate drive circuit 215, the voltage Va in accordance with the switching is output from the half bridge circuit 216. Similarly, by Q3 and Q4 being switched in accordance with changes of the level of the PWM signal input to the gate drive circuit 219, the voltage Vb in accordance with the switching is output from the half bridge circuit 220. The output voltage Va of the half bridge circuit 216 is applied to the point "a" of the AC transformer 20, and the output voltage Vb of the half bridge circuit 220 is applied to the point "b" of the AC transformer 20.

As illustrated in FIG. 4A and FIG. 4B, because the duty ratio of the PWM signal for driving the half bridge circuit 216 is different than the duty ratio of the PWM signal for driving the half bridge circuit 220, the voltage Va and the voltage Vb result in different voltages. Thus, an electrical potential difference occurs between terminal "a" and terminal "b" of the AC transformer 20, and a current flows on the primary side of the AC transformer 20 (between the point "a" and the point "b"). As a result, a high voltage output obtained by superimposing the AC high voltage and the DC high voltage occurs on the secondary side of the AC transformer 20, and is output to the charging roller 2.

FIG. 10 illustrates an example of each waveform of the voltages Vc1 and Vc2, the electrical potential difference ΔV (=Vc1−Vc2), and the PWM signal input to the gate drive circuit 215, corresponding to that shown in FIG. 9A and FIG. 9B. Note that the voltage that occurs at Fb1 is not considered for the voltage Vc1 of FIG. 10, and, in other words, the actual waveform of the voltage Vc1 is a waveform obtained by superimposing a waveform of the electrical potential difference ΔV between Vc1 and Vc2 (=Vc1−Vc2) on the waveform of Vc1 illustrated in FIG. 10.

As illustrated in FIG. 10, in an interval where the input PWM signal is the H-level (Q1 is in the off state and Q2 is in the on state), Vc1 becomes equivalent to the charge voltage of C1 (Vcc−Vf1), and Vc2 becomes 0V, which is equivalent to the potential of ground. In contrast, in an interval where the input PWM signal is the L-level (Q1 is in the on state and Q2 is in the off state), Vc1 becomes a voltage obtained by adding the charge voltage of C1 to Vin (Vin+Vcc−Vf1), and Vc2 becomes the voltage output from the first direct-current power supply (Vin).

In addition, the electrical potential difference ΔV between Vc1 and Vc2 becomes equivalent to the charge voltage (Vcc−Vf1) except for the time immediately after the input PWM signal has switched to the H-level or the L-level. However, immediately after the input PWM signal has switched between the H-level and the L-level (in other words, immediately after Q1 and Q2 have switched between the off state and the on state), the electrical potential difference ΔV becomes a voltage obtained by adding the voltage that occurs between both ends of Fb1 to the charge voltage of C1. This is because, immediately after the input PWM signal has switched between the H-level and the L-level, the charging (discharge) current of C1 flows to Fb1, and a voltage occurs at Fb1. Immediately after the input PWM signal switches from the H-level to the L-level the electrical potential difference ΔV becomes small, and immediately after the input PWM signal switches from the L-level to the H-level, the electrical potential difference ΔV becomes large.

The electrical potential difference ΔV for when the input PWM signal switches to the H-level becomes the voltage obtained by adding the voltage Vfb that occurs at Fb1 to the charge voltage of C1 (Vcc−Vf1), when D3 as illustrated in FIG. 6B is not provided. Meanwhile, if D3 is provided as illustrated in FIG. 5, FIG. 9A, and FIG. 9B, the voltage that occurs at Fb1 is restricted to a voltage that does not exceed a threshold voltage Vf3 that is a voltage for D3 to enter a conductive state. This is because D3 enters an on state (the conductive state) when the voltage between both ends of Fb1 reaches the threshold voltage Vf3. By this, the electrical potential difference ΔV when the input PWM signal switches to the H-level is restricted. In this way, D3 operates to limit the voltage that occurs at Fb1 when Q1 switches between the on state and the off state.

By such action of D3, the maximum value of the voltage Vc1 that is applied to the gate drive circuit 215a is limited to a voltage obtained by adding the sum of the charge voltage of C1 and the threshold voltage Vf3 of D3 (Vcc−Vf1+Vf3) to Vin. In other words, in comparison to the case in which D3 is not provided (FIG. 6B and FIG. 8), an increase of the maximum value of the voltage Vc1 that is applied to the gate drive circuit 215a can be suppressed to Vf3.

Accordingly, by virtue of the present embodiment, a need to increase the tolerable voltage of parts in the gate drive circuit 215a ceases. In other words, it is possible to prevent a tolerable voltage needed in the gate drive circuit 215a from becoming high due to a voltage that occurs in Fb1 that is provided in the path 600 in which the charging current of the bootstrap capacitor C1 flows. Accordingly, it is possible to realize a driving circuit for the half bridge circuit 216 without using high-voltage tolerant parts that lead to cost increases. In addition, even if D3 enters the on state, because the path 600 of the charging current of C1 does not change (to the path 610 of FIG. 6B), it is possible to sufficiently charge C1. As a result, stable switching of Q1 becomes possible.

In the embodiment described above, a ferrite bead (Fb1) is used as the inductance component that is inserted into the path 600 for suppressing radiation noise due to the charging current of C1. However, instead of a ferrite bead, another inductance component, such as a pattern inductance component, may be used as the inductance component inserted into the path 600.

In addition, in the embodiment described above, an explanation was given of an example in which a Schottky barrier diode is used as diode D3. Because a Schottky barrier diode has a low threshold voltage, it is possible to set the voltage that occurs at Fb1 to be very low. Accordingly, if the difference between the part tolerable voltage of the bootstrap circuit 217 and the charge voltage of C1 is low, using a Schottky barrier diode is effective. In contrast, if there is a margin in the difference between the part tolerable voltage of the bootstrap circuit 217 and the charge voltage of C1, a diode other than a Schottky barrier diode can be used.

In addition, the embodiment described above may be similarly applied to another power supply circuit, such as a power supply circuit for the secondary transfer roller 57, the primary transfer roller 53, and the developer 4 included in the image forming station 10, as well as the power supply circuit (the charging high voltage substrate 100) of the charging roller 2.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A power supply circuit comprising:
a bridge circuit having a first switching element connected to a first direct-current power supply and a second switching element connected in series with the first switching element, and configured to output a voltage, in accordance with switching of the first switching element and of the second switching element, to a load;
first and second drive circuits configured to drive the first and second switching elements, respectively, so that the first and second switching elements alternatingly enter an on state in accordance with an input pulse signal;
a capacitor connected between the first drive circuit and an output terminal of the bridge circuit, and configured to generate a charge voltage used for driving of the first switching element by the first drive circuit, in accordance with charging by being supplied with a charging current from a second direct-current power supply while the first switching element is in an off state;
an inductance component for noise suppression provided in a path in which the charging current flows; and
a voltage limit element connected in parallel with the inductance component, and configured to limit a voltage that occurs at the inductance component.

2. The power supply circuit according to claim 1, wherein the inductance component is provided between the capacitor and the output terminal, and the voltage limit element operates to limit the voltage that occurs at the inductance component when the first switching element switches between the on state and the off state.

3. The power supply circuit according to claim 1, wherein the voltage limit element is a diode arranged in a direction in which a current from the second direct-current power supply is passed, and the voltage that occurs at the inductance component is limited to a voltage that does not exceed a threshold voltage that is a voltage at which the diode enters a conductive state.

4. The power supply circuit according to claim 3, wherein the diode is a Schottky barrier diode.

5. The power supply circuit according to claim 1, wherein a voltage obtained by adding the charge voltage to a voltage of the output terminal is inputted to the first drive circuit, and the first drive circuit outputs the inputted voltage to the first switching element as a driving voltage, when the first switching element switches from the off state to the on state.

6. The power supply circuit according to claim 1, wherein a bootstrap circuit, for outputting to the first drive circuit, a voltage obtained by adding the charge voltage to a voltage of the output terminal, is configured by (i) the capacitor, and (ii) a diode, for which an anode terminal is connected to the second direct-current power supply and a cathode terminal is connected to the first drive circuit and the capacitor.

7. The power supply circuit according to claim 6, wherein the first and second switching elements are connected in series between the first direct-current power supply and ground, and the output terminal is provided at a connection point between the first switching element and the second switching element, and, when the first switching element enters the off state and the second switching element enters the on state, the diode of the bootstrap circuit enters a conductive state by a potential of the output terminal becoming equivalent to the ground, the charging current is supplied from the second direct-current power supply to the capacitor via the diode, and the charge voltage is input to the first drive circuit.

8. The power supply circuit according to claim 7, wherein, when the first switching element enters the on state and the second switching element enters the off state, the diode of the bootstrap circuit enters a non-conductive state by the potential of the output terminal becoming equivalent to the first direct-current power supply, and a voltage obtained by adding the charge voltage to the output voltage of the first direct-current power supply is input to the first drive circuit.

9. The power supply circuit according to claim 1, wherein, while the first switching element is in the off state, the charging current flows in a path from the second direct-current power supply to ground via the capacitor, the output terminal, and the second switching element that is in the on state.

10. The power supply circuit according to claim 1, wherein the second drive circuit is connected to the second direct-current power supply and outputs, to the second switching element, a voltage input from the second direct-current power supply as a driving voltage when the second switching element switches from the off state to the on state.

11. An image forming apparatus comprising:
(A) an image formation unit configured to form an image on a recording material; and
(B) a power supply circuit configured to supply a voltage to the image formation unit, wherein the power supply circuit comprises:
(a) a bridge circuit having a first switching element connected to a first direct-current power supply and a second switching element connected in series with the first switching element, and configured to output a voltage, in accordance with switching of the first switching element and of the second switching element, to a load;
(b) first and second drive circuits configured to drive the first and second switching elements, respectively, so that the first and second switching elements alternatingly enter an on state in accordance with an input pulse signal;
(c) a capacitor connected between the first drive circuit and an output terminal of the bridge circuit, and configured to generate a charge voltage used for driving of the first switching element by the first drive circuit in accordance with charging by being supplied with a charging current from a second direct-current power supply while the first switching element is in an off state;
an inductance component for noise suppression provided in a path in which the charging current flows; and
a voltage limit element connected in parallel with the inductance component, and configured to limit a voltage that occurs at the inductance component.

12. The image forming apparatus according to claim 11, wherein the image formation unit includes an image carrier and a charging unit configured to charge the image carrier, and the power supply circuit supplies the charging unit with a voltage for charging the image carrier.

* * * * *